United States Patent
Hamada

(10) Patent No.: US 11,456,229 B2
(45) Date of Patent: Sep. 27, 2022

(54) THERMALLY CONDUCTIVE SHEET

(71) Applicant: SEKISUI CHEMICAL CO., LTD., Osaka (JP)

(72) Inventor: Masahiro Hamada, Shiraoka (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 0 days.

(21) Appl. No.: 16/631,340

(22) PCT Filed: Jul. 24, 2018

(86) PCT No.: PCT/JP2018/027696
§ 371 (c)(1),
(2) Date: Jan. 15, 2020

(87) PCT Pub. No.: WO2019/022070
PCT Pub. Date: Jan. 31, 2019

(65) Prior Publication Data
US 2020/0227337 A1    Jul. 16, 2020

(30) Foreign Application Priority Data
Jul. 24, 2017    (JP) .............................. JP2017-142796

(51) Int. Cl.
*H01L 23/373*    (2006.01)
*B32B 27/20*    (2006.01)
(Continued)

(52) U.S. Cl.
CPC ............ *H01L 23/373* (2013.01); *B32B 27/20* (2013.01); *C09K 5/14* (2013.01); *H01L 23/36* (2013.01);
(Continued)

(58) Field of Classification Search
CPC ......... H01L 23/373; H01L 23/36; H05K 7/20; B32B 2307/302
See application file for complete search history.

(56) References Cited

U.S. PATENT DOCUMENTS 4,722,973 A * 2/1988 Yamaoka ................. C08K 5/14
525/193
10,329,424 B2    6/2019 Watanabe et al.
(Continued)

FOREIGN PATENT DOCUMENTS

CN    1603383 A    4/2005
DE    29522138 U1    3/2000
(Continued)

OTHER PUBLICATIONS

PolarTherm® Boron Nitride Filler grade PT 110 document from https://www.momentive.com/docs/default-source/productdocuments/boron-nitride-powder-polartherm-and-polartherm-ptx-additives/polartherm-bn-filler-grade-pt110.pdf?sfvrsn=b487a42d_14 on Jan. 22, 2021, 2 pages. (Year: 2012).*
(Continued)

*Primary Examiner* — Vivian Chen
(74) *Attorney, Agent, or Firm* — Foley & Lardner LLP

(57) ABSTRACT

A thermally conductive sheet according to the present invention is a thermally conductive sheet comprising a thermally conductive filler, the thermally conductive sheet having a thermal conductivity of 7 W/m·K or more, a 30% compression strength of 1500 kPa or less, and a tensile strength of 0.08 MPa or more. According to the present invention, a thermally conductive sheet having excellent thermally conductive properties, flexibility, and handling properties can be provided.

14 Claims, 1 Drawing Sheet

(51) Int. Cl.
- *C09K 5/14* (2006.01)
- *H01L 23/36* (2006.01)
- *H05K 7/20* (2006.01)
- *C08K 3/01* (2018.01)
- *C08K 7/00* (2006.01)
- *C08J 5/18* (2006.01)
- *C08K 7/18* (2006.01)
- *B32B 5/14* (2006.01)
- *C08K 5/14* (2006.01)
- *C08K 3/013* (2018.01)
- *C08K 3/04* (2006.01)
- *C08K 3/10* (2018.01)
- *C08K 3/14* (2006.01)
- *C08K 3/105* (2018.01)
- *C08K 7/04* (2006.01)
- *C08K 3/11* (2018.01)

(52) U.S. Cl.
CPC .............. *H05K 7/20* (2013.01); *B32B 5/14* (2013.01); *B32B 5/145* (2013.01); *B32B 2264/10* (2013.01); *B32B 2264/105* (2013.01); *B32B 2264/108* (2013.01); *B32B 2264/201* (2020.08); *B32B 2264/202* (2020.08); *B32B 2264/308* (2020.08); *B32B 2307/302* (2013.01); *B32B 2307/51* (2013.01); *B32B 2307/536* (2013.01); *B32B 2307/54* (2013.01); *C08J 5/18* (2013.01); *C08K 3/01* (2018.01); *C08K 3/013* (2018.01); *C08K 3/04* (2013.01); *C08K 3/10* (2013.01); *C08K 3/105* (2018.01); *C08K 3/11* (2018.01); *C08K 3/14* (2013.01); *C08K 5/14* (2013.01); *C08K 7/00* (2013.01); *C08K 7/04* (2013.01); *C08K 7/18* (2013.01); *H01L 23/3733* (2013.01)

(56) References Cited

U.S. PATENT DOCUMENTS

| | | | |
|---|---|---|---|
| 11,046,871 B2* | 6/2021 | Nagai | B29C 48/08 |
| 11,136,484 B2* | 10/2021 | Hamada | C08K 3/28 |
| 2002/0158332 A1* | 10/2002 | Masayuki | H01L 23/3737 257/E23.09 |
| 2005/0004305 A1 | 1/2005 | Yamada et al. | |
| 2005/0049345 A1* | 3/2005 | Greiner | F28F 21/062 524/439 |
| 2009/0230348 A1* | 9/2009 | Fukui | C08L 83/04 252/78.3 |
| 2010/0009109 A1* | 1/2010 | Ozawa | H01L 23/3737 428/41.8 |
| 2011/0009544 A1* | 1/2011 | Funahashi | C08L 83/04 524/261 |
| 2011/0040007 A1* | 2/2011 | Chandrasekhar | H01B 1/22 524/404 |
| 2013/0112389 A1* | 5/2013 | Yajima | B32B 15/06 165/185 |
| 2015/0030835 A1 | 1/2015 | Tanaka et al. | |
| 2015/0316332 A1 | 11/2015 | Kato et al. | |
| 2016/0263791 A1* | 9/2016 | Uibel | B29C 45/0013 |
| 2018/0194122 A1* | 7/2018 | Kumamoto | H05K 7/20 |
| 2018/0265743 A1* | 9/2018 | Nagai | C08J 9/0061 |
| 2018/0355219 A1* | 12/2018 | Nagai | B32B 27/00 |
| 2019/0040225 A1* | 2/2019 | Tassinari | C08K 3/04 |
| 2020/0227337 A1 | 7/2020 | Hamada | |
| 2022/0073805 A1* | 3/2022 | Hoshiyama | C08K 3/38 |

FOREIGN PATENT DOCUMENTS

| | | | |
|---|---|---|---|
| JP | H05-065347 A | 3/1993 | |
| JP | 2001-118974 A | 4/2001 | |
| JP | 2004-288825 A | 10/2004 | |
| JP | 2005-042096 A | 2/2005 | |
| JP | 2005-325212 A | 11/2005 | |
| JP | 2006-111644 A | 4/2006 | |
| JP | 2008-094877 A | 4/2008 | |
| JP | 2010-132856 A | 6/2010 | |
| JP | 2010-132866 A | 6/2010 | |
| JP | 2010132866 A * | 6/2010 | |
| JP | 2011-001540 A | 1/2011 | |
| JP | 2011-057466 A | 3/2011 | |
| JP | 2011-162642 A | 8/2011 | |
| JP | 2012-038763 A | 2/2012 | |
| JP | 2014-209537 A | 11/2014 | |
| JP | 2015-092534 | 5/2015 | |
| JP | 2015-092534 A | 5/2015 | |
| JP | 2015-231012 A | 12/2015 | |
| JP | 2016-204570 A | 12/2016 | |
| JP | 2017-028234 A | 2/2017 | |
| JP | 2017-126614 A | 7/2017 | |
| JP | 2019-024045 A | 2/2019 | |
| JP | 6746540 B2 | 8/2020 | |
| TW | 201631117 A | 9/2016 | |
| WO | WO-2013/099089 A1 | 7/2013 | |
| WO | WO-2014/083890 A1 | 6/2014 | |
| WO | WO-2016/103424 A1 | 6/2016 | |
| WO | WO 2016/129257 A * | 8/2016 | |
| WO | WO-2016129257 A1 * | 8/2016 | C08J 5/18 |
| WO | WO 2018/101445 A * | 6/2018 | |

OTHER PUBLICATIONS

Machine translation of JP 2008-094877 A (Year: 2008).*
Office Action dated Aug. 3, 2020 for corresponding Chinese Patent Application No. 201880048063.0.
International Searching Authority, "International Search Report," issued in connection with International Patent Application No. PCT/JP2018/027696, dated Oct. 9, 2018.
International Searching Authority, "Written Opinion," issued in connection with International Patent Application No. PCT/JP2018/027696, dated Oct. 9, 2018.
Extended European Search Report dated Feb. 19, 2021 for European Patent Application No. 18837721.2.
"7.3 Testing Machine" with Partial English Translations.
"Carbon materials (graphite materials) are the materials that have high thermal conductivity" with partial English translations.
"Table-3 Various characteristics and thermal shock resistance of various carbon materials and ceramic" with partial English translations.
Masahiro Toyoda; "Exfoliation of Graphite and its applications"; 2008; No. 233; pp. 157-165.
Opposition filed on Feb. 26, 2021 for corresponding Japanese Patent Application No. 2017-142796.
Third Party Submission filed on Mar. 30, 2021 for Japanese Patent Application No. 2020-132566.
Office Action dated Oct. 20, 2021 issued in a corresponding Chinese Patent Application No. 11021019120, (7 pages).
Japanese third-party opinion dated Sep. 22, 2021, for corresponding Japanese Patent Application No. 2021-700213, (7 pages).
Toho Industrial Rubber Corporation, "Rubber sponge sheet (9 Products)", with partial English-language machine translation, date unknown, URL: http://c81035-test.ekzm.net/products/gum_sponge/gum_sheet/.
Opposition filed on Feb. 26, 2021 against corresponding Japanese Patent Application No. 2017-142796.
Notice of Reasons for Refusal issued in corresponding Japanese Patent Application No. 2020-132566 dated Jul. 20, 2021.

* cited by examiner

THERMALLY CONDUCTIVE SHEET

CROSS-REFERENCE TO RELATED APPLICATIONS

The present application claims priority under 37 U.S.C. § 371 to International Patent Application No. PCT/JP2018/027696, filed Jul. 24, 2018, which claims priority to and the benefit of Japanese Patent Application No. 2017-142796, filed on Jul. 24, 2017. The contents of these applications are hereby incorporated by reference in their entireties.

TECHNICAL FIELD

The present invention relates to a thermally conductive sheet comprising a thermally conductive filler.

BACKGROUND ART

A thermally conductive sheet is mainly disposed between a heat generator such as a semiconductor package and a heat dissipator such as aluminum or copper and has a function of promptly transferring heat generated at the heat generator to the heat dissipator.

In recent years, the amount of heat generation per unit area of a semiconductor package has become large due to enhancements in integration of semiconductor devices and in density of wiring in semiconductor packages, and as a result, a demand for a thermally conductive sheet which has a more enhanced thermal conductivity and can facilitate prompter heat dissipation than a conventional thermally conductive sheet has been increasing.

In addition, a flexible thermally conductive sheet having a good shape followability is desired in order to allow the thermally conductive sheet to adhere to heat generators such as semiconductor packages having various shapes.

PTL1 describes the invention which relates to a highly thermally conductive silicone rubber in which a thermally conductive filler is blended, and it is shown in PTL1 that a highly thermally conductive property, as high as a thermal conductivity of about 8.0 W/m·K, can be achieved. In addition, PTL2 describes the invention which relates to a heat-dissipating putty sheet in which liquid silicone and a thermally conductive filler are blended, and it is shown in PTL2 that a highly thermally conductive property, as high as 3 W/m·K or more, can be achieved.

CITATION LIST

Patent Literature

PTL1: JP 2005-325212 A
PTL2: JP 2005-42096 A

SUMMARY OF INVENTION

Technical Problem

However, the highly thermally conductive silicone rubber described in PTL1 has highly thermally conductive properties but is hard, as hard as having a durometer A hardness of about 90, and therefore there has been room for improvements in terms of flexibility.

It is considered that the heat-dissipating putty sheet described in PTL2 has highly thermally conductive properties and a relatively excellent flexibility. However, the heat-dissipating putty sheet, when peeled from an adherend such as a film, is hard to peel off completely and trouble such as tearing (rupture) in the middle is liable to occur, so that the handling properties have not been satisfactory.

The present invention has been made in consideration of the above-described conventional problems, and an object of the present invention is to provide a thermally conductive sheet having excellent thermally conductive properties, flexibility, and handling properties.

Solution to Problem

The present inventors have conducted diligent studies in order to achieve the above-described object to find that a thermally conductive sheet having particular thermal conductivity, 30% compression strength, and tensile strength solves the above-described problems and completed the present invention.

That is, the present invention relates to the following [1] to [15].

[1] A thermally conductive sheet comprising a thermally conductive filler, the thermally conductive sheet having a thermal conductivity of 7 W/m·K or more, a 30% compression strength of 1500 kPa or less, and a tensile strength of 0.08 MPa or more.
[2] The thermally conductive sheet according to [1], further comprising a resin.
[3] The thermally conductive sheet according to [1] or [2], wherein the thermally conductive filler is a non-spherical filler.
[4] The thermally conductive sheet according to any one of [1] to [3], wherein the thermally conductive filler has an aspect ratio of 10 or more.
[5] The thermally conductive sheet according to any one of [1] to [4], wherein a major axis of the thermally conductive filler is oriented at an angle of 60° or more to a sheet face.
[6] The thermally conductive sheet according to any one of [2] to [5], wherein the resin has a viscosity of 10 to 2000 Pa·s at 25° C.
[7] The thermally conductive sheet according to any one of [2] to [6], having a content of the thermally conductive filler of 180 to 700 parts by mass per 100 parts by mass of the resin.
[8] The thermally conductive sheet according to any one of [1] to [7], wherein the thermally conductive filler has a volume percentage of 35 to 75% by volume.
[9] The thermally conductive sheet according to [1] or [2], wherein the thermally conductive filler is a spherical filler.
[10] The thermally conductive sheet according to [2] or [9], wherein the resin has a viscosity of 10 Pa·s or less.
[11] The thermally conductive sheet according to [2], [9], or [10], having a content of the thermally conductive filler of 1000 to 3000 parts by mass per 100 parts by mass of the resin.
[12] The thermally conductive sheet according to [1], [2], [9], [10], or [11], wherein the thermally conductive filler has a volume percentage of 65 to 95% by volume.
[13] The thermally conductive sheet according to any one of [1] to [12], wherein a gel fraction of at least one of surface layer portions is larger than a gel fraction of an inner layer portion.
[14] The thermally conductive sheet according to any one of [1] to [13], wherein the thermally conductive filler has a thermal conductivity of 12 W/m·k or more.
[15] The thermally conductive sheet according to any one of [2] to [14], wherein the resin has a glass transition temperature of 25° C. or less.

Advantageous Effects of Invention

According to the present invention, a thermally conductive sheet having excellent thermally conductive properties, flexibility, and handling properties can be provided.

DESCRIPTION OF EMBODIMENTS

Thermally Conductive Sheet

Figure 1:
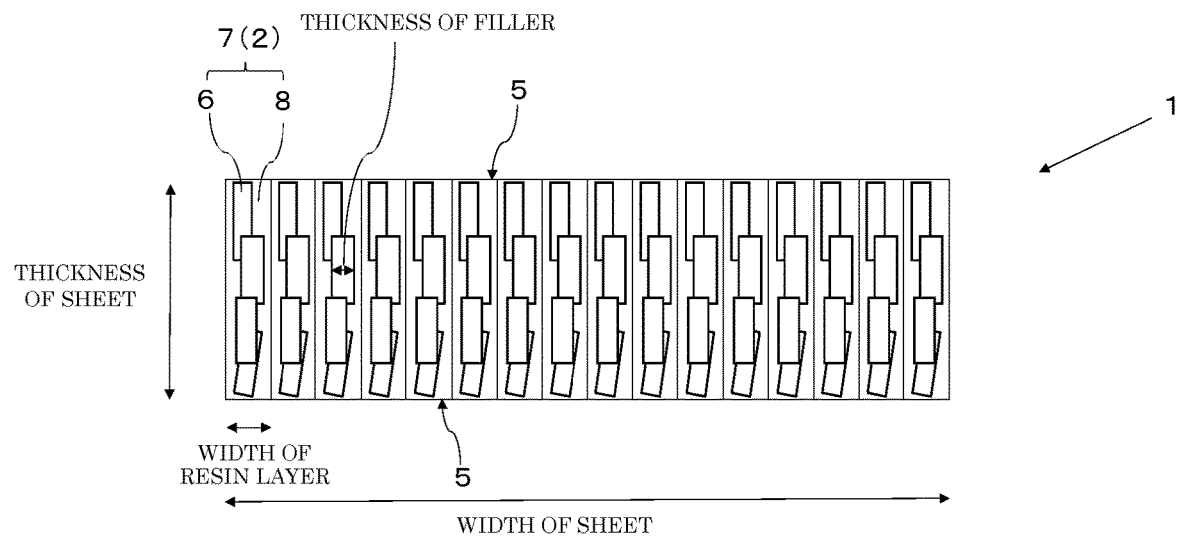
FIG. 1 is a schematic sectional view of a thermally conductive sheet composed of a laminated body.

A thermally conductive sheet according to the present invention is a thermally conductive sheet comprising a thermally conductive filler, the thermally conductive sheet having a thermal conductivity of 7 W/m·k or more, a 30% compression strength of 1500 kPa or less, and a tensile strength of 0.08 MPa or more.

In a thermally conductive sheet comprising a thermally conductive filler, there is a tendency that when a large amount of the thermally conductive filler is comprised in order to enhance the thermally conductive properties, the flexibility is generally lowered; however, the thermally conductive sheet according to the present invention is a thermally conductive sheet in which a high thermal conductivity and a satisfactory flexibility are achieved. In addition to this, the thermally conductive sheet according to the present invention has a tensile strength of a certain value or more and also has excellent handling properties such as being unlikely to rupture when peeled from an adherend. That is, the thermally conductive sheet according to the present invention is a thermally conductive sheet having an excellent physical property balance among thermally conductive properties, flexibility, and handling properties.

As described above, the thermally conductive sheet according to the present invention is a thermally conductive sheet having excellent various physical properties. The satisfactory physical properties are achieved by adjusting individual structures, the composition, and the like of the thermally conductive filler and the like constituting the thermally conductive sheet.

Resin

The thermally conductive sheet according to the present invention preferably comprises a resin. The type of the resin constituting the thermally conductive sheet is not particularly limited but is preferably a rubber and an elastomer resin from the viewpoint of making the flexibility satisfactory.

The glass transition temperature of the rubber and the elastomer resin is preferably lower than room temperature (for example, 25° C. or less). A thermally conductive sheet using such a rubber and an elastomer resin has an excellent flexibility.

Examples of the type of the rubber and the elastomer resin include an acrylonitrile butadiene rubber, a liquid acrylonitrile butadiene rubber, an ethylene-propylene-diene rubber, liquid ethylene-propylene-diene rubber, an ethylene-propylene rubber, a liquid ethylene-propylene rubber, a natural rubber, a liquid natural rubber, a polyisoprene rubber, a liquid polyisoprene rubber, a polybutadiene rubber, a liquid polybutadiene rubber, a hydrogenated polybutadiene rubber, a liquid hydrogenated polybutadiene rubber, a styrene-butadiene block copolymer, a liquid styrene-butadiene block copolymer, a hydrogenated styrene-butadiene block copolymer, a liquid hydrogenated styrene-butadiene block copolymer, a hydrogenated styrene-butadiene-styrene block copolymer, a liquid hydrogenated styrene-butadiene-styrene block copolymer, a hydrogenated styrene-isoprene block copolymer, a liquid hydrogenated styrene-isoprene block copolymer, a hydrogenated styrene-isoprene-styrene block copolymer, a liquid hydrogenated styrene-isoprene-styrene block copolymer, silicone, liquid silicone, an acrylic rubber, and a liquid acrylic rubber (it is to be noted that acrylic rubber means polymerized product of monomer containing acrylic acid ester and/or methacrylic acid ester). Among these, liquid rubbers and liquid elastomer resins are preferable, and a liquid acrylonitrile butadiene rubber, a liquid ethylene-propylene-diene rubber, a liquid polyisoprene rubber, a liquid polybutadiene rubber, and liquid silicone are preferable. In addition, the above-described rubbers and elastomer resins which are not liquid are preferably used by being kneaded with a liquid resin of the same type or the like in order to obtain flexibility.

From the viewpoint of improving the flexibility of the thermally conductive sheet, the resin is preferably liquid, and the viscosity of the resin at 25° C. is preferably 2000 Pa·s or less, more preferably 1000 Pa·s or less, and still more preferably 200 Pa·s or less, and is preferably 1 Pa·s or more. In addition, in a case where two or more resins are mixed and used, the viscosity after mixing the resins is preferably as described above.

From the viewpoint of making the thermally conductive properties, flexibility, and handling properties of the thermally conductive sheet satisfactory, it is preferable that the viscosity of the resin be appropriately adjusted according to the type of the thermally conductive filler, which will be described later.

Thermally Conductive Filler

The thermally conductive filler constituting the thermally conductive sheet according to the present invention is dispersed in the thermally conductive sheet. More specifically, the thermally conductive filler is dispersed in the resin. The thermal conductivity of the thermally conductive filler is not particularly limited but is preferably 12 W/m·K or more, more preferably 15 to 70 W/m·K, and still more preferably 25 to 70 W/m·K.

Examples of the material for the thermally conductive filler include carbides, nitrides, oxides, hydroxides, metals, and carbon-based materials.

Examples of the carbides include silicon carbide, boron carbide, aluminum carbide, titanium carbide, and tungsten carbide.

Examples of the nitrides include silicon nitride, boron nitride, boron nitride nanotubes, aluminum nitride, gallium nitride, chromium nitride, tungsten nitride, magnesium nitride, molybdenum nitride, and lithium nitride.

Examples of the oxides include iron oxide, silicon oxide (silica), aluminum oxide (alumina) (including hydrates of aluminum oxide (such as boehmite)), magnesium oxide, titanium oxide, cerium oxide, and zirconium oxide. In addition, examples of the oxides include: transition metal oxides such as barium titanate; and further, indium tin oxide and antimony tin oxide in which a metal ion is doped.

Examples of the hydroxides include aluminum hydroxide, calcium hydroxide, and magnesium hydroxide.

Examples of the metals include copper, gold, nickel, tin, iron, or alloys thereof.

Examples of the carbon-based materials include carbon black, graphite, diamond, graphene, fullerene, carbon nanotubes, carbon nanofibers, nanohorns, carbon microcoils, and nanocoils.

The thermally conductive filler other than those described above include talc, which is a silicate mineral.

These thermally conductive fillers can be used singly, or two or more of these can be used together. From the viewpoint of the thermally conductive properties, the thermally conductive filler is preferably at least one selected from the group consisting of aluminum oxide, magnesium oxide, boron nitride, aluminum nitride, graphene, boron nitride nanotubes, carbon nanotubes, and diamond. In a case where the thermally conductive filler is a non-spherical filler, which will be described later, the thermally conductive filler is preferably at least any one of boron nitride and graphene, and on the other hand, in a case where the thermally conductive filler is a spherical filler, the thermally conductive filler is preferably aluminum oxide. Boron nitride is more preferably used in applications where electric insulation is further required.

The shape of the thermally conductive filler is not particularly limited and may be a spherical filler or a non-spherical filler. The term "spherical" herein means a shape having a ratio of major diameter/minor diameter of 1.0 to 2.0 and preferably 1.0 to 1.5 on average and does not necessarily mean a perfect sphere. In addition, the term "non-spherical" means a shape other than the spherical shape.

The average particle diameter of the thermally conductive filler is preferably 0.1 to 300 μm, more preferably 0.5 to 100 μm, and still more preferably 5 to 50 μm. The average particle diameter can be determined by measuring the particle size distribution with a laser diffraction particle size distribution measurement apparatus.

The content of the thermally conductive filler in the thermally conductive sheet is preferably 180 to 3000 parts by mass and more preferably 200 to 2500 parts by mass per 100 parts by mass of the resin.

As will be described later, the content of the thermally conductive filler is preferably adjusted according to the shape of the filler.

Other Additives

If necessary, an additive that is generally used for a thermally conductive sheet, such as an antioxidant, a heat stabilizer, a colorant, a flame retardant, an anti-static agent, a filler other than the above-described thermally conductive filler, and a decomposition temperature-adjusting agent, may be blended in the thermally conductive sheet according to the present invention.

Physical Properties of Thermally Conductive Sheet

From the viewpoint of making the heat-dissipating properties of the sheet satisfactory, the thermal conductivity of the thermally conductive sheet is preferably 8 W/m·K or more, and more preferably 10 W/m·K or more. In addition, the thermal conductivity of the thermally conductive sheet is usually 100 W/m·K or less, and preferably 20 W/m·K or less.

From the viewpoint of making the flexibility of the sheet satisfactory, the 30% compression strength of the thermally conductive sheet is preferably 1000 kPa or less, more preferably 800 kPa or less, and still more preferably 500 kPa or less. In addition, the 30% compression strength of the thermally conductive sheet is usually 50 kPa or more, and preferably 200 kPa or more.

From the viewpoint of making the handling properties of the sheet satisfactory, the tensile strength of the thermally conductive sheet is preferably 0.1 MPa or more. In addition, from the viewpoint of flexibility, the tensile strength of the thermally conductive sheet is preferably 1.5 MPa or less.

If necessary, the thermally conductive sheet may be crosslinked according to the types of the thermally conductive filler and the resin. The degree of crosslinking of the thermally conductive sheet is expressed by a gel fraction.

From the viewpoint of making the flexibility satisfactory, the gel fraction of the whole thermally conductive sheet is preferably 50% or less, more preferably 40% or less, and still more preferably 20% or less.

The thermal conductivity, 30% compression strength, tensile strength, and gel fraction described above can be measured by the methods described in Examples.

In addition, from the viewpoint of making the handling properties satisfactory, the gel fraction of at least one of the surface layer portions may be made larger than the gel fraction of the inner layer portion, or the gel fractions of both of the surface layer portions may be made larger than the gel fraction of the inner layer portion. The gel fraction correlates with the extent of crosslinking of the resin, and generally, the larger the extent of crosslinking is, the larger the gel fraction is. The method for making the gel fraction of the surface layer portion larger than that of the inner layer portion is not particularly limited, and, for example, in a case where irradiation with an electron beam, which will be described later, is used, the acceleration voltage and the amount of irradiation with the electron beam may be adjusted.

It is to be noted that the surface layer portion refers to a region from the surface (sheet face) to 25% of the thickness of the thermally conductive sheet, and the inner layer portion means a region other than the surface layer portion.

The thermally conductive filler comprised in the thermally conductive sheet according to the present invention may be a spherical filler or a non-spherical filler, but the filler content, the type of the resin, the structure of the thermally conductive sheet, and the like which are suitable for achieving desired physical properties of the sheet are different depending on the shape of the filler. Hereinafter, these will individually be described.

Thermally Conductive Sheet (A) Comprising Non-Spherical Filler

The thermally conductive sheet according to the present invention in a case where it is a thermally conductive sheet (A) comprising a non-spherical filler as a thermally conductive filler will be described. By using the non-spherical filler, the tensile strength of the thermally conductive sheet is likely to be higher than in a case where a spherical filler is used, and therefore the handling properties are likely to be satisfactory. In addition, it is easy to improve the thermally conductive properties in a relatively small amount of the filler, and therefore the thermally conductive sheet in which a satisfactory flexibility and highly thermally conductive properties are achieved is easily obtained.

Examples of the non-spherical filler include plate-like fillers such as a scale-like filler and a flake-like filler, a needle-like filler, a fibrous filler, a dendritic filler, and a filler having an indefinite shape. From the viewpoint of making the thermally conductive properties of the thermally conductive sheet satisfactory, plate-like fillers are preferable, and among the plate-like fillers, a scale-like filler is preferable.

From the viewpoint of improving the thermally conductive properties, the aspect ratio of the thermally conductive filler is preferably 10 or more, and more preferably 15 or more.

By orientating the thermally conductive filler having a high aspect ratio at a high orientation angle in the thermally conductive sheet (A), as will be described later, the thermally conductive properties in the thickness direction can be further improved.

It is to be noted that the aspect ratio refers to a ratio of the maximum length to the minimum length (direction perpendicular to direction of maximum length) of the thermally conductive filler (maximum length/minimum length), and, for example, in a case where the shape is plate-like, the aspect ratio refers to a ratio of the maximum length to the thickness of the filler (maximum length/thickness). The aspect ratio may be determined as an average value taken when a sufficient number (for example, 250) of the thermally conductive fillers are observed with a scanning electron microscope.

From the viewpoint of improving the thermal conductivity, the minimum length (corresponds to thickness in the case of plate-like filler) of the thermally conductive filler is preferably 0.05 to 500 µm and more preferably 0.25 to 250 µm.

In a case where the thermally conductive sheet (A) comprises a resin, the content of the thermally conductive filler in the thermally conductive sheet (A) is preferably 180 to 700 parts by mass, more preferably 200 to 600 parts by mass, and still more preferably 300 to 500 parts by mass per 100 parts by mass of the resin. When the content is 180 parts by mass or more, the thermally conductive properties are enhanced, so that the thermal conductivity specified in the present invention is easily achieved. In addition, when the content is 700 parts by mass or less, the flexibility is likely to be satisfactory.

The volume percentage of the thermally conductive filler in the thermally conductive sheet (A) is preferably 35 to 75% by volume and more preferably 40 to 65% by volume. The volume percentage of the thermally conductive filler is a value based on the whole amount of the thermally conductive sheet and can be calculated from the mass of each component constituting the thermally conductive sheet. For example, the volume percentage can be calculated by dividing the mass of each component by the density of each component at 23° C.

In the thermally conductive sheet (A), the major axis of the thermally conductive filler is preferably oriented at more than 45°, more preferably 50° or more, still more preferably 60° or more, still more preferably 70° or more, and still more preferably 80° or more to a sheet face which is a surface of the thermally conductive sheet. In a case where the thermally conductive filler is oriented in such a manner, the thermal conductivity in the thickness direction of the thermally conductive sheet is improved. It is to be noted that the direction of the major axis of the thermally conductive filler coincides with the direction of the above-described maximum length of the thermally conductive filler.

The angle can be measured by observing a section in the thickness direction of the thermally conductive sheet with a scanning electron microscope. For example, a thin film slice of the central portion in the thickness direction of the thermally conductive sheet is first prepared. The angle can be determined by observing the thermally conductive filler in the thin film slice with a scanning electron microscope (SEM) at 3000 magnifications to measure an angle formed by the major axis of the observed filler and the face constituting the sheet face. In the present specification, the angle of 45° or more, 50° or more, 60° or more, 70° or more, or 80° or more means that the average value of the values measured in the manner as describe above is equal to or larger than the angle. For example, in the expression "oriented at an angle of 70° or more," 70° refers to an average value, and therefore the existence of the thermally conductive filler the orientation angle of which is less than 70° is not denied. It is to be noted that in a case where the formed angle exceeds 90°, the supplementary angle is adopted as a measured value.

In the thermally conductive sheet (A), the viscosity of the resin at 25° C. is preferably 10 to 2000 Pa·s, more preferably 20 to 1000 Pa·s, and still more preferably 30 to 200 Pa·s. Setting the viscosity of the resin to 10 Pa·s or more makes molding the thermally conductive sheet easy. On the other hand, setting the viscosity of the resin to 2000 Pa·s or less lowers the compression strength of the thermally conductive sheet to improve the flexibility.

It is to be noted that the viscosity of the resin can be measured by the method described in Examples.

From the viewpoint of making the flexibility satisfactory, the gel fraction of the whole thermally conductive sheet (A) is preferably 50% or less, more preferably 40% or less, and still more preferably 20% or less.

In addition, the gel fraction of the surface layer portions of the thermally conductive sheet (A) may be the same as that of the inner layer portion, the gel fraction of the surface layer portions may be higher than that of the inner layer portion.

Laminated Body

The thermally conductive sheet (A) according to the present invention may be single-layered or a laminated body. From the viewpoint of making the thermally conductive properties satisfactory, the thermally conductive sheet (A) is preferably a laminated body in which resin layers each containing a resin and a non-spherical filler are laminated. One example of embodiments of the laminated body in which resin layers each containing a resin and a non-spherical filler are laminated will be described with reference to FIG. 1.

In FIG. 1, hatching for indicating a section of a resin is omitted in order to make clear the existence of a thermally conductive plate-like filler 6 which is a non-spherical filler. In addition, each filler in the figure overlaps with vertically adjacent fillers, but overlap of fillers is not essential in the present invention.

As illustrated in FIG. 1, a thermally conductive sheet 1 has a structure in which a plurality of resin layers 2 are laminated. A perpendicular face to the lamination face of a plurality of resin layers 2 is a sheet face 5 which is the surface of the resin sheet 1.

The thickness of the thermally conductive sheet 1 (namely, distance between sheet face 5 and sheet face 5) is not particularly limited and can be in a range of, for example, 0.1 to 30 mm.

The thickness of one layer of the resin layers 2 (resin layer width) is not particularly limited but is preferably 1000 µm or less and more preferably 500 µm or less and can preferably be 0.1 µm or more, more preferably 0.5 µm or more, and still more preferably 1 µm or more. By adjusting the thickness in this way, the thermally conductive properties can be enhanced.

The resin layer 2 is a thermally conductive resin layer 7 comprising a thermally conductive filler 6. The thermally conductive resin layer 7 has a structure in which the thermally conductive filler 6 having thermally conductive properties is dispersed in a resin 8.

In each resin layer 2, the thermally conductive filler is oriented at an angle of more than 45°, more preferably 50° or more, still more preferably 60° or more, still more preferably 70° or more, and still more preferably 80° or more to the sheet face, as described above.

The thickness of the thermally conductive resin layer 7 is preferably set to 1 to 1000 times, more preferably 1 to 500 times the thickness of the thermally conductive filler 6 contained in the thermally conductive resin layer 7.

Setting the width of the thermally conductive resin layer 7 to the range allows the thermally conductive filler 6 to be oriented easily in such a way that the major axis of the thermally conductive filler 6 has an angle of approximately 90° to the sheet face. It is to be noted that the width of the thermally conductive resin layer 7 does not have to be uniform as long as the width is within the range.

Method for Producing Thermally Conductive Sheet (A)

A method for producing the thermally conductive sheet (A) according to the present invention is not particularly limited, and when a single-layered thermally conductive sheet (A) is produced, the thermally conductive sheet may be molded, for example, by supplying the thermally conductive non-spherical filler, the resin, and, if necessary, an additive or additives into an extruder to perform melt-kneading, and extruding a melt-kneaded product in the form of a sheet from the extruder.

Method for Producing Laminated Body

The thermally conductive sheet (A) composed of a laminated body according to the present invention can be produced by any method, and the thermally conductive sheet (A) can be produced by a method including a kneading step; a lamination step; and, if necessary, a slicing step, as will be described below.

Kneading Step

A thermally conductive resin composition is prepared by kneading the thermally conductive filler and the resin.

With respect to the kneading, for example, the thermally conductive filler and the resin are preferably kneaded using a twin screw kneader such as Plastomill or a twin screw extruder while being heated, and thereby the thermally conductive resin composition in which the thermally conductive filler is uniformly dispersed in the resin can be obtained.

Subsequently, by pressing the thermally conductive resin composition, a sheet-like resin layer (thermally conductive resin layer) can be obtained.

Lamination Step

In the lamination step, a laminated body having an n-layered structure is prepared by laminating the resin layer obtained in the kneading step. As a lamination method, for example, a method in which the resin layer prepared in the kneading step is divided into $x_i$, and resultant resin layers are laminated to prepare a laminated body having an $x_i$-layered structure, thereafter, if necessary, hot pressing is performed, and further, if necessary, the divide, the lamination, and the hot pressing are thereafter repeated to prepare a laminated body having a width of D µm and having an n-layered structure can be used.

In a case where the thermally conductive filler is plate-like, the width (D µm) of the laminated body after the lamination step and the thickness (d µm) of the thermally conductive filler preferably satisfy $0.0005 \leq d/(D/n) \leq 1$, more preferably satisfy $0.001 \leq d/(D/n) \leq 1$, and still more preferably satisfy 0.02 d/(D/n) 1.

In a case where a plurality of numbers of times of molding is performed in this way, the molding pressure in each time can be made smaller than in a case where molding is performed once, and therefore a phenomenon such as destruction of a laminated structure attributable to molding can be avoided.

As another lamination method, for example, a method in which an extruder provided with a multilayer formation block is used, and the laminated body having an n-layered structure and having a thickness of D µm is obtained through co-extrusion molding by adjusting the multilayer formation block can also be used.

Specifically, the thermally conductive resin composition obtained in the kneading step is introduced to both of a first extruder and a second extruder, and the thermally conductive resin composition is extruded simultaneously from the first extruder and the second extruder. The thermally conductive resin compositions extruded from the first extruder and from the second extruder are fed to a feed block. The thermally conductive resin compositions extruded from the first extruder and from the second extruder join in the feed block. Thereby, a two-layered body in which the thermally conductive resin compositions are laminated can be obtained. Next, the two-layered body is conveyed to the multilayer formation block to be divided plurally along a plurality of faces each being parallel to the direction of extrusion and perpendicular to the lamination face, thereafter resultant two-layered bodies are laminated, and thus the laminated body having an n-layered structure and having a thickness of D µm can be prepared. On this occasion, the thickness per layer (D/n) can be made to be a desired value by adjusting the multilayer formation block.

Slicing Step

The laminated body obtained in the lamination step is sliced in a direction parallel to the direction of lamination, and the thermally conductive sheet (A) can thereby be prepared.

Additional Step

In the method for producing the thermally conductive sheet (A), a step of crosslinking the resin may be provided. Crosslinking may be performed, for example, by a method of performing irradiation with ionizing radiation such as an electron beam, an α ray, a β ray, or a γ ray, a method using an organic peroxide, or the like. However, when the gel fraction of the surface layer portion of the thermally conductive sheet (A) is made high, the sheet face (sheet surface) is preferably irradiated with ionizing radiation after the slicing step, and an electron beam is preferable among the types of ionizing radiation. The acceleration voltage in a case where irradiation with an electron beam is performed for the purpose of making the gel fraction of the surface layer portion high is preferably 200 to 700 kV and more preferably 250 to 500 kV. The amount of irradiation with an electron beam is preferably 200 to 450 kGy and more preferably 250 to 400 kGy.

Thermally Conductive Sheet (B) Comprising Spherical Filler

The thermally conductive sheet according to the present invention in a case where it is a thermally conductive sheet (B) comprising a spherical filler as a thermally conductive filler will be described. In a case where the spherical filler is used, the anisotropy is smaller than that of the non-spherical filler, and therefore the thermal conductivity is unlikely to be changed by the state of existence (state of orientation) of the filler in the thermally conductive sheet. Therefore, the thermally conductive sheet is produced relatively easily and stably.

The average particle diameter of the thermally conductive filler is not particularly limited but is preferably 0.5 to 100 µm and more preferably 5 to 50 µm. The average particle diameter can be determined by measuring the particle size distribution with a laser diffraction particle size distribution measurement apparatus.

The content of the thermally conductive filler in the thermally conductive sheet (B) is preferably 1000 to 3000 parts by mass and more preferably 1500 to 2500 parts by mass per 100 parts by mass of the resin. When the content is 1000 parts by mass or more, the thermally conductive properties are enhanced, so that the thermal conductivity specified in the present invention is easily achieved. When the content is 3000 parts by mass or less, the flexibility is likely to be satisfactory.

In addition, the volume percentage of the thermally conductive filler in the thermally conductive sheet (B) is preferably 65 to 95% by volume and more preferably 70 to 90% by volume. The volume percentage of the thermally conductive filler is a value based on the whole amount of the thermally conductive sheet and can be calculated from the mass of each component constituting the thermally conductive sheet. For example, the volume percentage of the thermally conductive filler can be calculated by dividing the mass of each component by the density of each component at 23° C.

In this way, a relatively large amount of the thermally conductive filler is preferably used in the thermally conductive sheet (B) from the viewpoint of making the thermally conductive properties satisfactory. When a large amount of a thermally conductive filler is used, the flexibility of a thermally conductive sheet is usually liable to be lowered, but by adjusting the viscosity of the resin, lowering of the flexibility can be suppressed.

In the thermally conductive sheet (B), the viscosity of the resin at 25° C. is preferably 10 Pa·s or less, and more preferably 5 Pa·s or less. By setting the viscosity of the resin to 10 Pa·s or less, the flexibility of the thermally conductive sheet is likely to be satisfactory. In addition, the viscosity of a resin is usually 0.001 Pa·s or more.

It is to be noted that the viscosity of the resin can be measured by the method described in Examples.

The thickness of the thermally conductive sheet (B) is not particularly limited and can be, for example, in a range of 0.1 to 30 mm.

From the viewpoint of making the flexibility satisfactory, the thermally conductive sheet (B) is preferably crosslinked.

Accordingly, the gel fraction of the whole thermally conductive sheet (B) is preferably 2 to 50%, preferably 3 to 30%, and more preferably 5 to 20%. By setting the gel fraction to 2% or more, the handling properties of the thermally conductive sheet (B) is made satisfactory, and by setting the gel fraction to 50% or less, the flexibility is made satisfactory.

From the viewpoint of making the handling properties more satisfactory, the gel fraction of at least one of the surface layer portions is preferably larger than the gel fraction of the inner layer portion. More preferably, the gel fractions of both of the surface layer portions are preferably larger than the gel fraction of the inner layer portion.

Method for Producing Thermally Conductive Sheet (B)

The thermally conductive sheet (B) composed of a laminated body according to the present invention can be produced by any method, and the thermally conductive sheet (B) can be produced, for example, by obtaining a thermally conductive resin composition in accordance with the kneading step described in the method for producing the thermally conductive sheet (A) and subsequently molding the resin composition into the form of a sheet with a press or the like.

A step of irradiating at least one of the surfaces (sheet faces) of the thermally conductive sheet (B) with ionizing radiation such as an electron beam, an α ray, a β ray, and a γ ray is preferably performed in order to make the gel fraction of the surface layer portion larger than the gel fraction of the inner layer portion after the step of forming the thermally conductive sheet (B) into the form of a sheet. Above all, a step of performing irradiation with an electron beam is preferable.

From the viewpoint of making the handling properties of the thermally conductive sheet (B) satisfactory, the acceleration voltage in a case where irradiation with an electron beam is performed is preferably 200 to 700 kV and more preferably 250 to 600 kV. From the same viewpoint, the amount of irradiation is preferably 200 to 500 kGy and more preferably 250 to 400 kGy.

As described above, the thermally conductive sheet according to the present invention has excellent thermally conductive properties, flexibility, and handling properties. For example, the thermally conductive sheet according to the present invention, when disposed between a heat generator and a heat dissipator inside an electronic device, can thereby facilitate heat dissipation from the heat generator to the heat dissipator utilizing such characteristics. This will be described with reference to the thermally conductive sheet 1 described in FIG. 1.

Figure 2:
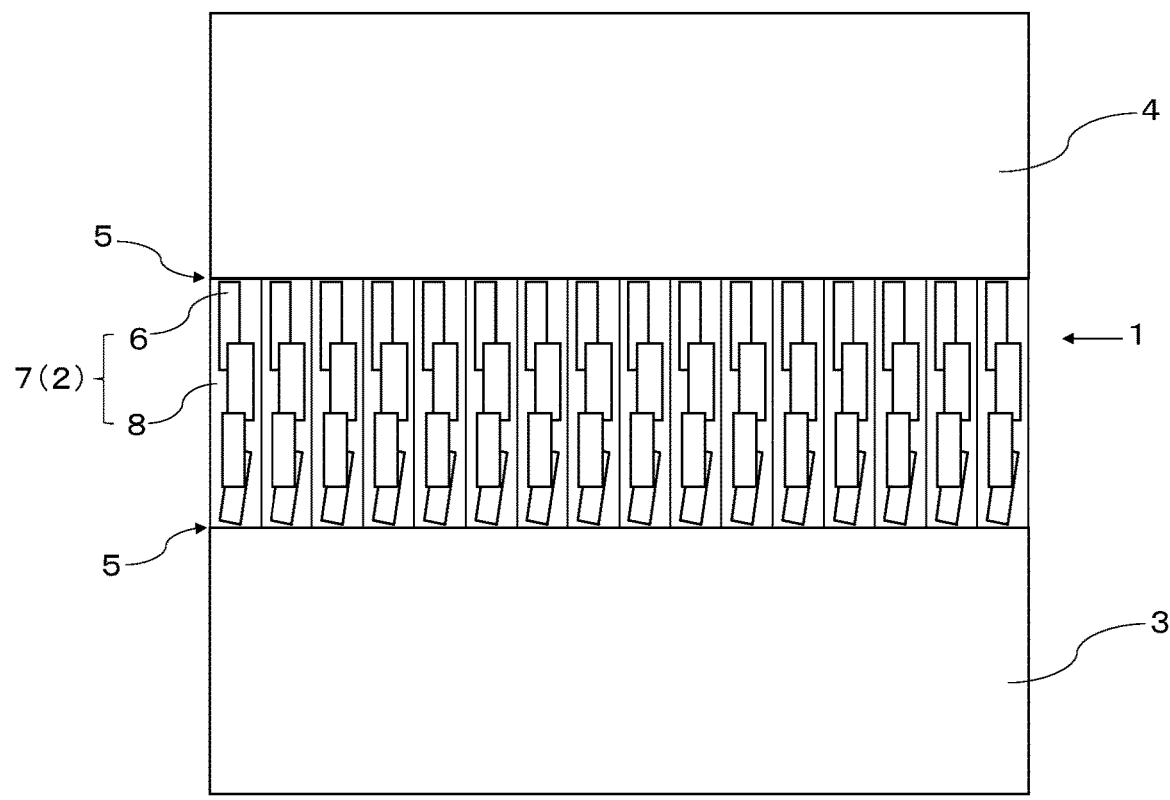
FIG. 2 is a schematic sectional view of a thermally conductive sheet composed of a laminated body in a use state.

As illustrated in FIG. 2, the sheet face 5 of the thermally conductive sheet 1 is disposed so as to be in contact with a heat generator 3 or a heat dissipator 4. In addition, the thermally conductive sheet 1 is disposed in a state of being compressed between the two members such as the heat generator 3 and the heat dissipator 4. It is to be noted that the heat generator 3 is, for example, a semiconductor package or the like, and the heat dissipator 4 is, for example, a metal or the like such as aluminum or copper. By using the thermally conductive sheet 1 in such a state, the heat generated at the heat generator 3 is easily diffused to the heat dissipator 4 to enable an efficient heat dissipation.

The present invention will be described in more detail with reference to Examples, but the present invention is not limited by these Examples at all.

Materials used in the following Examples and Comparative Examples are as follows.

(1) Resin

Liquid polyisoprene rubber 1: trade name "LIR-30" manufactured by KURARAY CO., LTD.
Liquid polyisoprene rubber 2: trade name "LIR-310" manufactured by KURARAY CO., LTD.
Liquid acrylonitrile butadiene rubber 1: trade name "N231L" manufactured by JSR Corporation
Acrylonitrile butadiene rubber 2:
Mixture of 7.2% by volume of the following (A) and 40.8% by volume of the following (B)
(A) Acrylonitrile butadiene rubber: trade name "N280" manufactured by JSR Corporation
(B) Liquid acrylonitrile butadiene rubber: trade name "N231L" manufactured by JSR Corporation
Liquid polybutadiene rubber 1: trade name "L-1203" hydrogenated grade manufactured by KURARAY CO., LTD.
Liquid polybutadiene rubber 2: trade name "LBR-300" manufactured by KURARAY CO., LTD.
Liquid polybutadiene rubber 3: trade name "Ricon 130" manufactured by Cray Valley
Liquid EPDM (liquid ethylene-propylene-diene rubber): trade name "PX-068" manufactured by Mitsui Chemicals, Inc.
Liquid silicone 1: trade name "KF-96H-100,000 cs" manufactured by Shin-Etsu Chemical Co., Ltd
Liquid silicone 2: trade name "KF-96H-500 cs" manufactured by Shin-Etsu Chemical Co., Ltd (2) Thermally Conductive Filler (i) Boron nitride, trade name "SGP" manufactured by Denka Company Limited
Shape; plate-like (scale-like)
Aspect ratio; 20
Thermal conductivity in direction of longitudinal side; 250 W/m·K
Thickness: 1 μm
(ii) Graphene, trade name "WGNP" manufactured by Bridgestone KGB, Co., Ltd.
Shape; plate-like (flake-like)
Aspect ratio; 15
Thermal conductivity in direction of longitudinal side; 1000 W/m·K
Thickness; 2 μm
(iii) Alumina (aluminum oxide), trade name "AS-20" manufactured by SHOWA DENKO K.K.
Shape: spherical
Average particle diameter; 22 μm
Methods of evaluating physical properties are as follows.

Viscosity

The viscosity of each resin in an amount of 50 g was measured at 25° C. with a B type viscometer (manufactured by TOYO SANGYO CO., LTD.).

Thermal Conductivity

The thermal conductivity in the thickness direction of each of obtained thermally conductive sheets was measured using a laser flash method thermal constant measurement apparatus ("LFA 447" manufactured by NETZSCH-Gerätebau GmbH).

30% Compression Strength

The 30% compression strength of each of obtained thermally conductive sheets was measured using "RTG-1250" manufactured by A&D Company, Limited. The measurement was performed setting the sample size to 2 mm×15 mm×15 mm, the setting temperature to 23° C., and the compression speed to 1 mm/min.

Tensile Strength

The tensile strength of each of obtained thermally conductive sheets was measured using "RTG-1250" manufactured by A&D Company, Limited. The measurement was performed setting the sample size to 1.5 mm×10 mm×60 mm, the setting temperature to 23° C., and the tensile speed to 500 mm/min.

Gel Fraction

The gel fraction of each thermally conductive sheet was measured as follows.
A g of the thermally conductive sheet was weighed and immersed in xylene of 120° C. for 24 hours, insoluble matter was subjected to filtration with 200-mesh wire netting, a residue on the wire netting was vacuum-dried to measure the weight (B g) of the dried residue, and the gel fraction was calculated according to the following expression using the weight (C g) of the filler in the thermally conductive sheet, the weight calculated from the weight of the thermally conductive sheet and the proportion of the filler blended. It is to be noted that the gel fraction was measured by taking out a sample of the thermally conductive sheet equally in the thickness direction in each Example and Comparative Example.

$$\text{Gel fraction (\% by weight)} = ((B-C)/A) \times 100$$

Orientation Angle

A section of each thermally conductive sheet was observed with a scanning electron microscope (S-4700 manufactured by Hitachi, Ltd.). An angle formed by each filler and the sheet face was measured for arbitrary 20 fillers from an image observed at 3000 magnifications, and the average value was adopted as the orientation angle.

Evaluation of Handling Properties

Each thermally conductive sheet having a size of 1.5 mm×20 mm×100 mm was stuck to a film (material is PET) at 40° C. Thereafter, a peeling test was performed under conditions of 23° C., a peeling angle of 90°, and a peeling speed of 30 mm/min.
A: The thermally conductive sheet can be peeled completely
B: The thermally conductive sheet is torn (ruptured) in the middle of peeling

EXAMPLE 1

A mixture consisting of 100 parts by mass of the liquid polyisoprene rubber 1 (trade name "LIR-30" manufactured by KURARAY CO., LTD.) and 400 parts by mass of boron nitride (trade name "SGP" manufactured by Denka Company Limited) was melt-kneaded and then pressed to obtain a sheet-like resin layer having a thickness of 0.5 mm, a width of 80 mm, and a depth of 80 mm. Next, as a lamination step, the obtained resin layer was divided into 16 equal pieces, and the resultant pieces were overlaid to obtain a laminated body composed of 16 layers and having a total thickness of 8 mm, a width of 20 mm, and a depth of 20 mm. Subsequently, the laminated body was sliced in parallel with the direction of lamination to obtain a thermally conductive sheet having a thickness of 2 mm, a width of 8 mm, and a depth of 20 mm. The thickness of one layer of the resin layers constituting the laminated body is 0.5 mm (500 μm). With respect to this thermally conductive sheet, the thermal conductivity, 30% compression strength, the orientation angle, the tensile strength, and the gel fraction were measured, and the handling properties were evaluated. With respect to the thermal conductivity, observation was performed from the direction of the section of the sheet (thickness direction). Evaluation results are shown in Table 1.

EXAMPLES 2 TO 9 AND COMPARATIVE EXAMPLE 3

A thermally conductive sheet was obtained in the same manner as in Example 1 except that formulation was changed as described in Table 1 to perform the measurement and the evaluation. Results are shown in Tables 1 and 2.

EXAMPLE 10

A thermally conductive sheet was obtained in the same manner as in Example 1 except that formulation was changed as described in Table 1. Subsequently, both of the faces of the thermally conductive sheet were irradiated with an electron beam of an acceleration voltage of 300 kV and a radiation dose of 400 kGy so that the gel fraction of the surface layer portions is larger than the gel fraction of the inner layer portion of the thermally conductive sheet after the irradiation with an electron beam, and thus both of the surface layer portions were crosslinked. With respect to the obtained thermally conductive sheet, the measurement and the evaluation were performed. Results are shown in Table 1.

EXAMPLE 11

A mixture consisting of 100 parts by mass of the liquid polybutadiene rubber 3 (trade name "Ricon 130" manufactured by Cray Valley) and 2000 parts by mass of alumina (trade name "AS-20" manufactured by SHOWA DENKO K.K.) was melt-kneaded and then pressed to obtain a thermally conductive sheet having a thickness of 2 mm, a width of 80 mm, and a depth of 80 mm. Subsequently, both of the faces of the thermally conductive sheet was irradiated with an electron beam of an acceleration voltage of 300 kV and a radiation dose of 400 kGy so that the gel fraction of the surface layer portions is larger than the gel fraction of the inner layer portion of the thermally conductive sheet after the irradiation with an electron beam, and thus both of the surface layer portions were crosslinked. With respect to the obtained thermally conductive sheet, the measurement and the evaluation were performed. Results are shown in Table 1.

COMPARATIVE EXAMPLE 1

A mixture consisting of 100 parts by mass of the liquid silicone 2 (trade name "KF-96H-500 cs" manufactured by Shin-Etsu Chemical Co., Ltd) and 260 parts by mass of boron nitride (trade name "SGP" manufactured by Denka Company Limited) was melt-kneaded and then pressed, but the mixture cannot be molded into the form of a sheet.

COMPARATIVE EXAMPLE 2

A mixture consisting of 100 parts by mass of the liquid polybutadiene rubber 3 (trade name "Ricon 130" manufactured by Cray Valley) and 2000 parts by mass of alumina (trade name "AS-20" manufactured by SHOWA DENKO K.K.) was melt-kneaded and then pressed to obtain a thermally conductive sheet having a thickness of 2 mm, a width of 80 mm, and a depth of 80 mm. With respect to the obtained thermally conductive sheet, the measurement and the evaluation were performed. Results are shown in Table 2.

COMPARATIVE EXAMPLE 4

A thermally conductive sheet was obtained in the same manner as in Example 10 except that the conditions of irradiation with an electron beam were changed to an acceleration voltage of 750 kV and an irradiation dose of 450 kGy. With respect to the obtained thermally conductive sheet, the measurement and the evaluation were performed. Results are shown in Table 2.

TABLE 1

| | | | Example | | | | | | | | | | | |
|---|---|---|---|---|---|---|---|---|---|---|---|---|---|---|
| | | | 1 | 2 | 3 | 4 | 5 | 6 | 7 | 8 | 9 | 10 | 11 |
| Composition | Resin [parts by mass] | Liquid polyisoprene rubber 1 | 100 | | | | | | | | | 100 | |
| | | Liquid polyisoprene rubber 2 | | 100 | | | | | | | | | |
| | | Liquid acrylonitrile-butadiene rubber 1 | | | 100 | | | | | | | | |
| | | Acrylonitrile-butadiene rubber 2 | | | | | | | | | 100 | | |
| | | Liquid polybutadiene rubber 1 | | | | 100 | | | | | | | |
| | | Liquid polybutadiene rubber 2 | | | | | | 100 | | 100 | | | |
| | | Liquid polybutadiene rubber 3 | | | | | | | | | | | 100 |
| | | Liquid EPDM | | | | | 100 | | | | | | |
| | | Liquid silicone 1 | | | | | | | 100 | | | | |
| | | Liquid silicone 2 | | | | | | | | | | | |
| | | Viscosity of resin [Pa · s] | 130 | 1400 | 850 | 35 | 280 | 74 | 100 | 280 | 1950 | 130 | 0.75 |
| | Thermally conductive filler (parts by mass) | Boron nitride | 400 | 350 | 280 | 350 | 350 | 350 | 260 | | 280 | 350 | |
| | | Graphene | | | | | | | | 200 | | | |
| | | Alumina | | | | | | | | | | | 2000 |

TABLE 1-continued

| | | Example | | | | | | | | | | |
|---|---|---|---|---|---|---|---|---|---|---|---|---|
| | | 1 | 2 | 3 | 4 | 5 | 6 | 7 | 8 | 9 | 10 | 11 |
| Performance | Orientation angle of thermally conductive filler [°] | 83 | 82 | 84 | 82 | 82 | 83 | 82 | 82 | 83 | 83 | — |
| | Thermal conductivity [W/m · K] | 11 | 11 | 8 | 11 | 10.5 | 11 | 8 | 9 | 8 | 11 | 7.5 |
| | 30% Compression strength [kPa] | 350 | 960 | 780 | 321 | 701 | 280 | 322 | 750 | 813 | 491 | 381 |
| | Tensile strength [MPa] | 0.27 | 0.50 | 0.41 | 0.17 | 0.34 | 0.21 | 0.26 | 0.37 | 0.65 | 0.43 | 0.19 |
| | Gel fraction [%] | 0 | 0 | 0 | 0 | 0 | 0 | 0 | 0 | 0 | 12 | 12 |
| | Handling properties | A | A | A | A | A | A | A | A | A | A | A |

TABLE 2

| | | | Comparative Example | | | |
|---|---|---|---|---|---|---|
| | | | 1 | 2 | 3 | 4 |
| Composition | Resin [parts by mass] | Liquid polyisoprene rubber 1 | | | | 100 |
| | | Liquid polyisoprene rubber 2 | | | | |
| | | Liquid acrylonitrile-butadiene rubber 1 | | | | |
| | | Acrylonitrile-butadiene rubber 2 | | | 100 | |
| | | Liquid polybutadiene rubber 1 | | | | |
| | | Liquid polybutadiene rubber 2 | | | | |
| | | Liquid polybutadiene rubber 3 | | 100 | | |
| | | Liquid EPDM | | | | |
| | | Liquid silicone 1 | | | | |
| | | Liquid silicone 2 | 100 | | | |
| | | Viscosity of resin [Pa · s] | 0.5 | 0.75 | 1950 | 130 |
| | Thermally conductive filler (parts by mass) | Boron nitride | 260 | | 150 | 350 |
| | | Graphene | | | | |
| | | Alumina | | 2000 | | |
| Performance | | Orientation angle of thermally conductive filler [°] | — | — | | 83 |
| | | Thermal conductivity [W/m · K] | — | 7.5 | 5.5 | 11 |
| | | 30% Compression strength [kPa] | — | 265 | 221 | 2500 |
| | | Tensile strength [MPa] | — | 0.07 | 0.17 | 2.87 |
| | | Gel fraction [%] | — | 0 | 0 | 71 |
| | | Handling properties | — | B | A | A |

Each of Examples 1 to 11 which are the thermally conductive sheets according to the present invention has high thermal conductivity and flexibility and satisfactory handling properties and is excellent as a thermally conductive sheet.

In contrast, each of Comparative Examples 1 to 4 does not satisfy the requirements of the present invention, and is inferior in performance to the thermally conductive sheets according to the present invention. In Comparative Example 1, a thermally conductive sheet cannot be molded. It is considered that this is because a resin having a low viscosity was used.

Comparative Example 2 uses a spherical filler and has the same composition as Example 11, but has a low tensile strength and poor handling properties. It is considered that this is because irradiation with an electron beam is not performed in Comparative Example 2 and therefore the surface layers are not crosslinked.

Comparative Example 3 has a low thermal conductivity, and it is considered that this is because the amount of the thermally conductive filler is small.

Comparative Example 4 has the same composition as Example 10 and has a higher compression strength than Example 10 and is inferior to Example 10 in the flexibility. It is considered that this is because the acceleration voltage and irradiation dose in the irradiation of the thermally conductive sheet with an electron beam in Comparative Example 4 are high, and thereby crosslinking progresses too much, making the sheet hard.

REFERENCE SIGNS LIST

1 Thermally conductive sheet
2 Resin layer
3 Heat generator
4 Heat dissipator
5 Sheet face
6 Thermally conductive filler
7 Thermally conductive resin layer
8 Resin

The invention claimed is:

1. A thermally conductive sheet comprising a thermally conductive filler and a resin, the thermally conductive sheet having a thermal conductivity of 7 W/m K or more, a 30% compression strength of 1500 kPa or less, and a tensile strength of 0.08 MPa or more,
wherein the resin being at least one elastomer resin selected from the group consisting of a acrylonitrile butadiene rubber, a ethylene-propylene-diene rubber, a polyisoprene rubber, a polybutadiene rubber, and a silicone, and
the sheet having a content of the thermally conductive filler of 180 to 3000 parts by mass per 100 parts by mass of the resin, and, the gel fraction of the thermally conductive sheet is 0 to 20%.

2. The thermally conductive sheet according to claim 1, wherein the thermally conductive filler is a non-spherical filler.

3. The thermally conductive sheet according to claim 1, wherein the thermally conductive filler has an aspect ratio of 10 or more.

4. The thermally conductive sheet according to claim 1, wherein a major axis of the thermally conductive filler is oriented at an angle of 60° or more to a sheet face.

5. The thermally conductive sheet according to claim 1, wherein the resin has a viscosity of 10 to 2000 Pa s at 25° C.

6. The thermally conductive sheet according to claim 2, having a content of the thermally conductive filler of 180 to 700 parts by mass per 100 parts by mass of the resin.

7. The thermally conductive sheet according to claim 1, wherein the content of the thermally conductive filler in the thermally conductive sheet is 35 to 75% by volume.

8. The thermally conductive sheet according to claim 1, wherein the thermally conductive filler is a spherical filler.

9. The thermally conductive sheet according to claim 1, wherein a viscosity of the resin at 25° C. is 10 Pa s or less.

10. The thermally conductive sheet according to claim 1, having a content of the thermally conductive filler of 1000 to 3000 parts by mass per 100 parts by mass of the resin.

11. The thermally conductive sheet according to claim 1, wherein the content of the thermally conductive filler in the thermally conductive sheet is 65 to 95% by volume.

12. The thermally conductive sheet according to claim 1, wherein a gel fraction of at least one of surface layer portions is larger than a gel fraction of an inner layer portion, the surface layer portion refers to a region from the surface to 25% of the thickness of the thermally conductive sheet, and the inner layer portion means a region other than the surface layer portion in the thermally conductive sheet.

13. The thermally conductive sheet according to claim 1, wherein the thermally conductive filler has a thermal conductivity of 12 W/m k or more.

14. The thermally conductive sheet according to claim 1, wherein the resin has a glass transition temperature of 25° C. or less. less.

* * * * *